(12) United States Patent
Shin et al.

(10) Patent No.: US 9,398,686 B2
(45) Date of Patent: Jul. 19, 2016

(54) TAPE PACKAGE AND DISPLAY APPARATUS INCLUDING THE SAME

(71) Applicant: Samsung Display Co., LTD., Yongin, Gyeonggi-Do (KR)

(72) Inventors: Ki-Hae Shin, Mokpo-si (KR); Jeong-Hun Go, Asan-si (KR); Hee-Un Ku, Daejeon (KR); Young-Sun Kim, Asan-si (KR); Hoe-Seok Na, Gwangmyeong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 160 days.

(21) Appl. No.: 14/454,850

(22) Filed: Aug. 8, 2014

(65) Prior Publication Data

US 2015/0237726 A1     Aug. 20, 2015

(30) Foreign Application Priority Data

Feb. 17, 2014   (KR) ........................ 10-2014-0017995

(51) Int. Cl.
| | |
|---|---|
| *H05K 1/11* | (2006.01) |
| *H05K 1/02* | (2006.01) |
| *H05K 3/36* | (2006.01) |
| *H01L 23/498* | (2006.01) |
| *H05K 1/18* | (2006.01) |
| *H05K 3/28* | (2006.01) |
| *H05K 3/32* | (2006.01) |

(52) U.S. Cl.
CPC ............ *H05K 1/028* (2013.01); *H01L 23/4985* (2013.01); *H05K 3/361* (2013.01); *H05K 1/189* (2013.01); *H05K 3/282* (2013.01); *H05K 3/323* (2013.01); *H05K 2201/053* (2013.01); *H05K 2201/09154* (2013.01); *H05K 2201/09227* (2013.01); *H05K 2201/09254* (2013.01); *H05K 2201/09727* (2013.01); *H05K 2201/10128* (2013.01); *H05K 2201/2009* (2013.01); *H05K 2203/1147* (2013.01)

(58) Field of Classification Search
CPC ....... H05K 1/11; H05K 5/0017; H05K 1/028; H05K 1/0296; H05K 2201/10128; H05K 23/4985; H05K 3/361; H05K 2203/1147; H05K 1/189; H05K 3/282; H05K 3/323; H01L 23/4985
See application file for complete search history.

(56) References Cited

U.S. PATENT DOCUMENTS

| | | | |
|---|---|---|---|
| 6,472,727 B2 * | 10/2002 | Miyazaki et al. ............. | 257/668 |
| 6,738,122 B2 | 5/2004 | Lim | |
| 6,853,430 B2 | 2/2005 | Murahashi et al. | |

(Continued)

FOREIGN PATENT DOCUMENTS

| | | |
|---|---|---|
| JP | 2006-084503 A | 3/2006 |
| KR | 1020050031628 A | 4/2005 |

(Continued)

*Primary Examiner* — Roy Potter
(74) *Attorney, Agent, or Firm* — Cantor Colburn LLP

(57) ABSTRACT

A tape package includes a base substrate including a signal transmitting area and a protruding area protruded from the signal transmitting area, an integrated circuit chip mounted on the base substrate, and a lead line disposed on the base substrate and including a first portion electrically connected with the integrated circuit chip, a second portion electrically connected with the first portion and extending in a first direction, and a third portion electrically connected with the second portion and extending in a second direction crossing the first direction.

20 Claims, 8 Drawing Sheets

(56) References Cited

U.S. PATENT DOCUMENTS

| | | |
|---|---|---|
| 7,349,054 B2 | 3/2008 | Kohtaka |
| 2004/0183745 A1 | 9/2004 | Choi |
| 2011/0267792 A1 | 11/2011 | Kim |
| 2013/0033669 A1 | 2/2013 | Liao et al. |

FOREIGN PATENT DOCUMENTS

| | | |
|---|---|---|
| KR | 1020050070363 A | 7/2005 |
| KR | 1020080049571 A | 6/2008 |
| KR | 1020080054570 A | 6/2008 |

* cited by examiner

TAPE PACKAGE AND DISPLAY APPARATUS INCLUDING THE SAME

This application claims priority to Korean Patent Application No. 10-2014-0017995, filed on Feb. 17, 2014, and all the benefits accruing therefrom under 35 U.S.C. §119, the contents of which are herein incorporated by reference in their entireties.

BACKGROUND

1. Field

The invention relates to a tape package and a display apparatus including the tape package. More particularly, the invention relates to a tape package and a display apparatus including the tape package capable of decreasing a size of light-blocking area.

2. Description of the Related Art

Recently, a liquid display apparatus having light weight and small size has been manufactured. A cathode ray tube ("CRT") display apparatus has been used due to a performance and a competitive price. However, the CRT display apparatus has a weakness with a size or portability. Therefore, the liquid display apparatus has been highly regarded due to small size, light weight and low-power-consumption of the liquid display apparatus.

Generally, a liquid crystal display ("LCD") apparatus has relatively thin thickness, light weight and low power consumption, and thus the LCD apparatus is used in monitors, laptop computers and cellular phones and so on. The LCD includes a LCD panel displaying images using a light transmittance of a liquid crystal, and a backlight assembly disposed under the LCD panel and providing light to the LCD panel.

The LCD panel is electrically connected with a driving part to drive the LCD panel. The LCD panel is electrically connected with the driving part through a tape package. The tape package includes a lead line, and the lead line is electrically connected with a data line of the LCD panel. A data line is formed on a light-blocking area to be connected with the tape package, so that a size of light-blocking area may be increased.

SUMMARY

Exemplary embodiments of the invention provide a tape package capable of decreasing a size of light-blocking area.

Exemplary embodiments of the invention further provide a display apparatus including the tape package.

In an exemplary embodiment of a tape package according to the invention, the tape package includes a base substrate including a signal transmitting area and a protruding area protruded from the signal transmitting area, an integrated circuit ("IC") chip mounted on the base substrate and a lead line disposed on the base substrate. The lead line includes a first portion electrically connected with the IC chip, a second portion electrically connected with the first portion and extending in a first direction, and a third portion electrically connected with the second portion and extending in a second direction crossing the first direction.

In an exemplary embodiment, the tape package may further include a protecting layer which covers the lead line.

In an exemplary embodiment, the lead line may further include a main lead line and a sub lead line which is branched off and extending from the main lead line.

In an exemplary embodiment, the lead line may further include a plurality of sub lead lines which is separated from each other and extends from the main lead line. A sum of widths of the plurality of sub lead lines may be smaller than a width of the main lead line.

In an exemplary embodiment, the tape package may further include a sealing part configured to fix the IC chip on the base substrate, and cover at least a portion of the main lead line.

In an exemplary embodiment, the protecting layer may cover the main lead line. The sealing part may cover the sub lead line and a portion of the protecting layer.

In an exemplary embodiment, a number of the IC chip mounted on the base substrate may be six.

In an exemplary embodiment, a number of the IC chip mounted on the base substrate may be four.

In an exemplary embodiment, a number of the IC chip mounted on the base substrate may be two.

In an exemplary embodiment, the base substrate may be a flexible substrate.

In an exemplary embodiment of a display apparatus according to the invention, the display apparatus includes a tape package and a display panel including a data line electrically connected with the output lead line. The tape package includes a base substrate including a signal transmitting area and a protruding area protruded from the signal transmitting area, an IC chip mounted on the base substrate and an output lead line electrically connected with the IC chip. The display panel includes a display area and peripheral area surrounding the display area. A plurality of data lines having a same length is disposed between the display area and the tape package.

In an exemplary embodiment, the display apparatus may further include a reinforcing part which is configured to fix the tape package to the display panel, and cover a portion of the output lead line.

In an exemplary embodiment, the tape package may further include a protecting layer disposed between the output lead line and the reinforcing part.

In an exemplary embodiment, the output lead line may include a main output lead line and a sub output lead line which is branched off and extends from the main output lead line.

In an exemplary embodiment, the display apparatus may further include a plurality of sub output lead lines which is separated from each other and extends from the main output lead line. A sum of widths of the plurality of sub output lead lines may be smaller than a width of the main output lead line.

In an exemplary embodiment, the sub output lead line of the tape package may be electrically connected with the display panel through a conductive adhesive layer disposed on the display panel. The conductive adhesive layer may include a plurality of conductive channels spaced apart from each other.

In an exemplary embodiment, the tape package may further include an input lead line disposed on the protruding area and including a main input lead line and a sub input lead line branching off and extending from the main input lead line and a sealing part fixing the IC chip on the base substrate and covering at least a portion of the main input lead line.

In an exemplary embodiment, the display apparatus may further include a driving part electrically connected with the input lead line of the tape package.

In an exemplary embodiment, the base substrate may be a flexible substrate.

In an exemplary embodiment, the IC chip may be mounted on the base substrate as a chip-on-film ("COF") structure.

According to the invention as explained above, since the output lead line disposed on the tape package extends substantially in a horizontal direction, data lines disposed on the signal input part may not extend in the horizontal direction but extend in a vertical direction. Thus, a space for dispersing the data lines in the horizontal direction may be omitted.

In addition, data lines disposed on the signal input part may have a same length. Thus, display quality of display apparatus may be improved.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
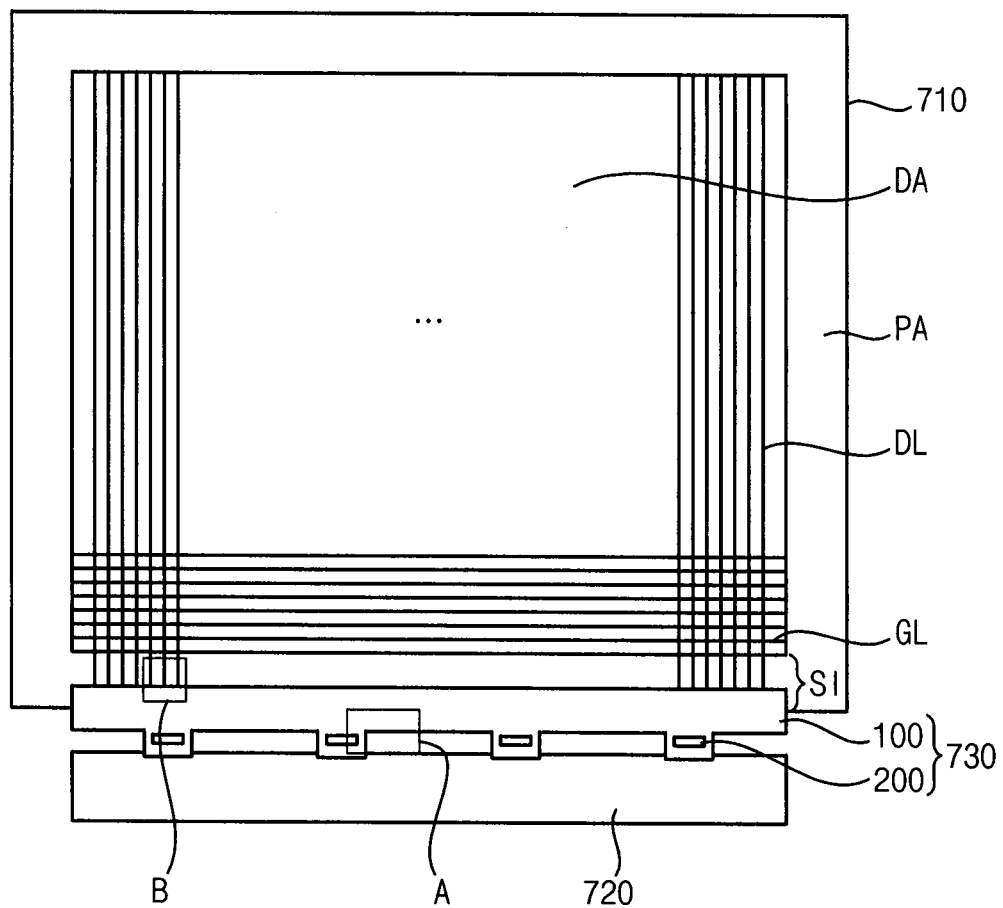
FIG. 1 is a plan view illustrating an exemplary embodiment of a display apparatus according to the invention.
Figure 1:

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

FIG. 1 is a plan view illustrating a display apparatus according to an exemplary embodiment of the invention.

Referring to FIG. 1, a display apparatus according to an exemplary embodiment of the invention includes a display panel 710, a printed circuit board ("PCB") 720 and a tape package 730.

The display panel 710 includes a display area DA and a peripheral area PA surrounding the display area DA. In an exemplary embodiment, the display panel 710 may include a lower substrate of a LCD apparatus. The display area DA includes a plurality of data lines DL, a plurality of gate lines GL, a plurality of switching elements and a plurality of pixel electrodes. Each of the data lines DL extends substantially in a second direction D2 to be arranged in a first direction D1 crossing the first direction D2. Each of the gate lines GL extends substantially in the first direction D1 to be arranged in the second direction D2. Each of the switching elements is electrically connected with the gate line GL and the data line DL. Each of the pixel electrodes is electrically connected with the switching element.

The peripheral area PA may include a signal input part SI.

A plurality of driving terminals electrically connected with terminals of the tape package 730 may be disposed on the signal input part SI. The terminals receive drive signals for driving a display panel 710. In an exemplary embodiment, the terminals receive data drive signals for driving a driving integrated circuit ("IC"). In an exemplary embodiment, the data drive signal may include analog power signals, logic power signals, a data signal, a clock signal, a gamma signal, a carry signal, etc. The signals transmitted to the terminals applied to the data line. The terminals are electrically connected with data lines of the display panel 710. The data lines disposed on the signal input part SI of the display panel 710 according to the exemplary embodiment extend only in the second direction D2. Thus, the data lines disposed on the signal input part SI of the display panel 710 may have a same length. In an exemplary embodiment, data lines extending in the first direction D1 may be omitted on the signal input part SI, so that a size of the signal input part SI may be decreased.

The tape package 730 is connected with the signal input part SI of the display panel 710. The tape package 730 may include a base substrate 100 and an IC chip 200. The base substrate 100 includes a material having relatively high flexibility. In an exemplary embodiment, the base substrate 100 may include polyimide and/or epoxy resin, for example. The IC chip 200 may be mounted on the base substrate 100. In an exemplary embodiment, the IC chip 200 may be mounted on the base substrate 100 as a chip-on-film ("COF") structure.

An end of the tape package 730 is connected with the signal input part SI of the display panel 710. Another end of the tape package 730 is connected with the PCB 720.

The PCB 720 may transmit a signal from an external apparatus to the IC chip 200. The IC chip 200 is mounted on the base substrate 100. The tape package 730 electrically connects the display panel 710 and the PCB 720. The IC chip 200 generates a data signal using a signal from the PCB 720. Thereafter, the IC chip 200 output the data signal to the data line DL. Portions "A", "B", and "C" will be further described with respect to FIGS. 2, 6 and 4, respectively.

Figure 2:
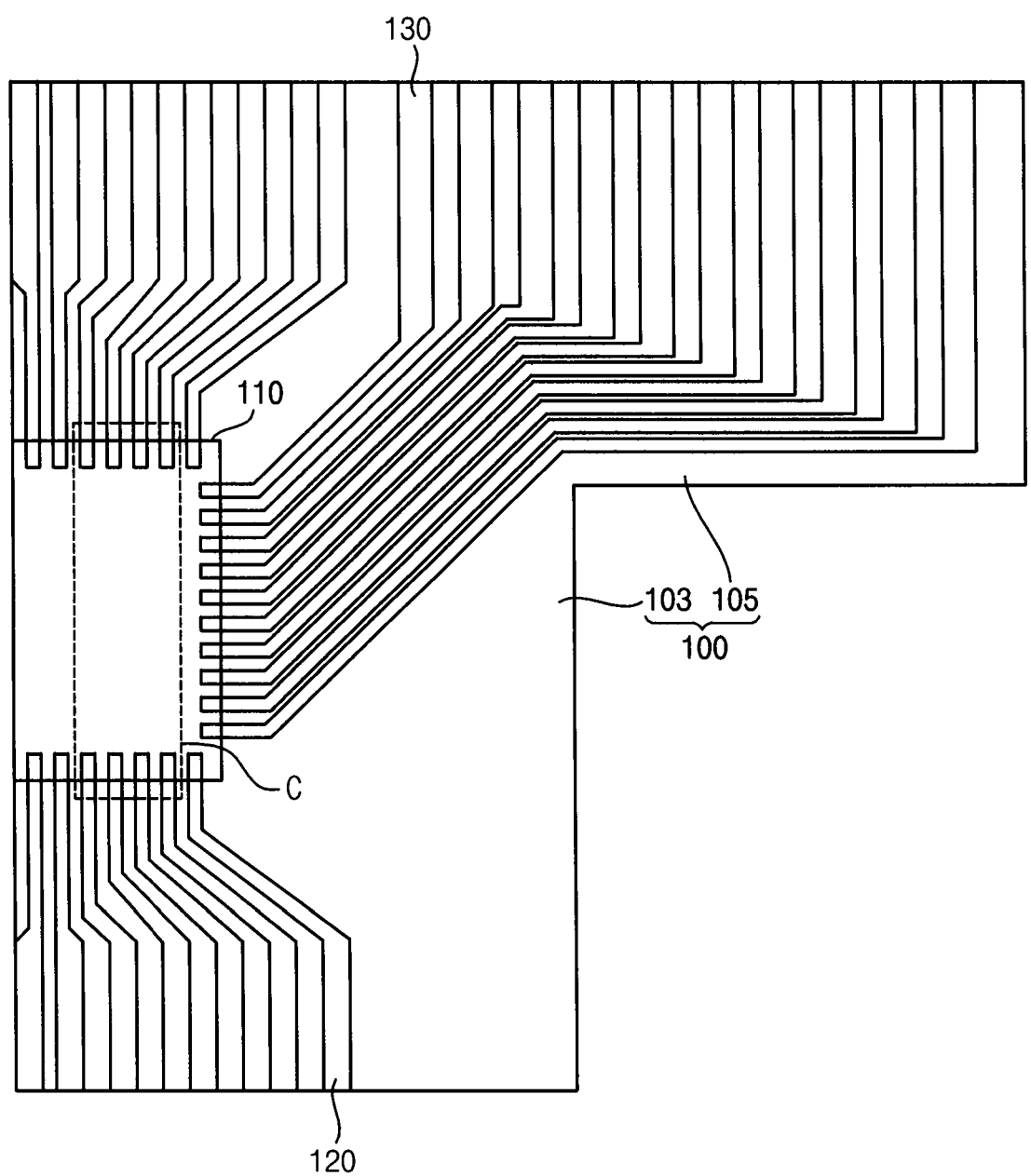
FIG. 2 is a plan view magnifying portion "A" of FIG. 1.

FIG. 2 is a plan view magnifying portion "A" of FIG. 1.

Referring to FIGS. 1 and 2, the tape package 730 includes a base substrate 100, an IC chip mounting area 110 and a circuit pattern. The base substrate 100 includes a signal transmitting area 105 and a protruding area 103 protruded from the signal transmitting area 105. The circuit pattern includes an output lead line 130 an input lead line 120.

The base substrate 100 includes a material having relatively high flexibility. In an exemplary embodiment, the base substrate 100 may include polyimide and/or epoxy resin, for example. The base substrate 100 includes a signal transmitting area 105 and a protruding area 103 protruded from the signal transmitting area 105. The output lead line 130 is disposed on the signal transmitting area 105. The output lead line 130 is electrically connected with terminals disposed on the signal input part SI of the display panel 710. The IC chip mounting area 110 and the input lead line 120 are disposed on the protruding area 103. The input lead line 120 is electrically connected with the PCB 720. An IC chip 200 may be mounted on the IC chip mounting area 110. In an exemplary embodiment, the IC chip 200 may be mounted on the base substrate 100 as a COF structure.

The input lead line 120 is disposed in the protruding area 103 of the base substrate 100. The input lead line 120 is connected with the IC chip mounting area 110. Detailed explanation about the input lead line 120 will be explained in FIG. 3.

The output lead line 130 is disposed in the signal transmitting area 105 of the base substrate 100. The output lead line 130 is connected with the IC chip mounting area 110. Detailed explanation about the output lead line 130 will be explained in FIG. 3.

The input lead line 120 of the tape package 730 is electrically connected with the PCB 720. The output lead line 130 of the tape package 730 is electrically connected with the display panel 710. An end of the tape package 730 is connected with the signal input part SI of the display panel 710. Another end of the tape package 730 is connected with the PCB 720. The PCB 720 may transmit a signal from an external apparatus to the IC chip 200. The IC chip 200 is mounted on the base substrate 100. The tape package 730 electrically connects the display panel 710 and the PCB 720. The IC chip 200 generates a data signal using a signal from the PCB 720. Thereafter, the IC chip 200 output the data signal to the data line DL.

The output lead line 130 may transmit a signal to the data line DL of the display panel 710. The output lead line 130 extends from the IC chip mounting area 110 to be connected with the display panel 710. An end of the output lead line 130 is electrically connected with the IC chip mounting area 110. The output lead line 130 extending from the IC chip mounting area 110 is dispersed substantially in the first direction D1. Another end of the output lead line 130 extending from the IC chip mounting area 110 extends substantially in the second direction D2. Thus, another end of the output lead line 130 may be aligned corresponded to the terminal disposed on the signal input part SI of the display panel 710.

Figure 3:
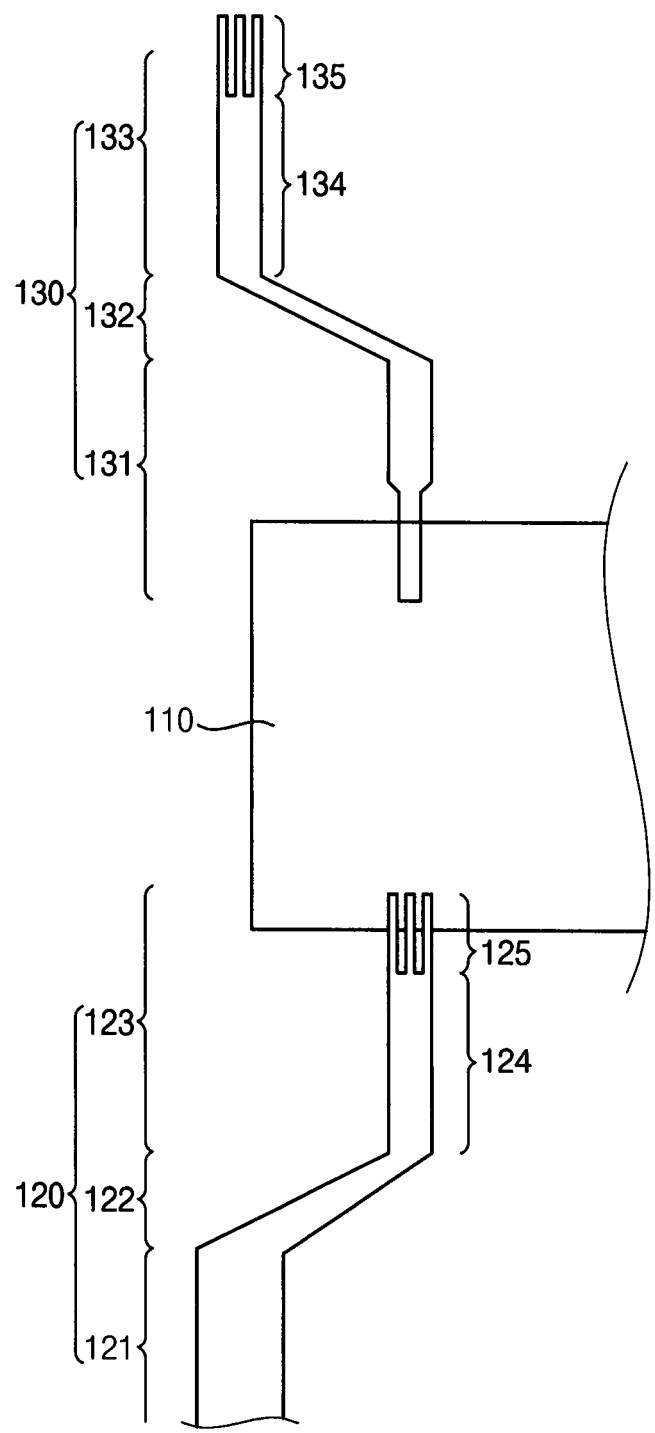
FIG. 3 is an enlarged view illustrating an input lead and an output lead of FIG. 2.

FIG. 3 is an enlarged view illustrating an input lead and an output lead of FIG. 2.

Referring to FIGS. 2 and 3, the input lead line 120 includes a first portion 121, a second portion 122, and a third portion 123. The output lead line 130 includes a first portion 131, a second portion 132, and a third portion 133.

The first portion 121 of the input lead line 120 is connected with the driving part of the PCB 720 (refer to FIG. 1). The second portion 122 of the input lead line 120 is connected with the first portion 121. The third portion 123 of the input lead line 120 is connected with the second portion 122. The third portion 123 is connected with the IC chip mounting area 110.

The third portion 123 of the input lead line 120 includes a main input lead line 124 and a sub input lead line 125. The sub input lead line 125 branches off and extends from the main input lead line 124. A plurality of the sub input lead lines 125 may be provided. Thus, a width of the sub input lead line 125 is smaller than that of the main input lead line 124, so that a bottleneck region is provided between the main input lead line 124 and the sub input lead line 125.

A sum of widths of the first portions 121 of the input lead lines 120 is greater than a sum of widths of the third portions 123. Thus, the first portions 121 which is connected with the PCB 720 (refer to FIG. 1) has a relatively large width, and is relatively far from adjacent input lead lines 120. In an exemplary embodiment, the third portions 123 which is connected with the IC chip 200 (refer to FIG. 4) has relatively small width is relatively close to adjacent input lead lines 120. Thus, terminals of the IC chip 200 (refer to FIG. 4) which are disposed in relatively small area may be connected with terminals of the PCB 720 (refer to FIG. 1) which are disposed in relatively large area through the input lead line 120.

The output lead line 130 includes a first portion 131, a second portion 132, and a third portion 133. The first portion 131 of the output lead line 130 is connected with the IC chip mounting area 110. The second portion 132 of the output lead line 130 is connected with the first portion 131. In an exemplary embodiment, the second portion 132 may extend substantially in a first direction D1. The third portion 133 of the output lead line 130 is connected with the second portion 132. The third portion 133 may extend in a second direction D2 crossing the first direction D1. The third portion 133 is connected with a display panel 710 (refer to FIG. 1) of the display apparatus.

The third portion 133 of the output lead line 130 includes a main output lead line 134 and a sub output lead line 135. The sub output lead line 135 branches off and extends from the main output lead line 134. A plurality of the sub output lead lines 135 may be provided. Thus, a width of the sub output lead line 135 is smaller than that of the main output lead line 134, so that a bottleneck region is provided between the main output lead line 134 and the sub output lead line 135.

A sum of widths of the third portions 133 of the output lead lines 130 is greater than a sum of widths of the first portions 131. Thus, the third portion 133 which is connected with the display panel 710 (refer to FIG. 1) has relatively large width, and is relatively far from adjacent output lead lines 130. In an exemplary embodiment, the first portion 131 which is connected with the IC chip 200 (refer to FIG. 4) has relatively small width is relatively close to adjacent output lead lines 130. Thus, terminals of the IC chip 200 (refer to FIG. 4) which are disposed in relatively small area may be connected with terminals of the display panel 710 (refer to FIG. 1) which are disposed in relatively large area through the output lead line 130.

Figure 4:
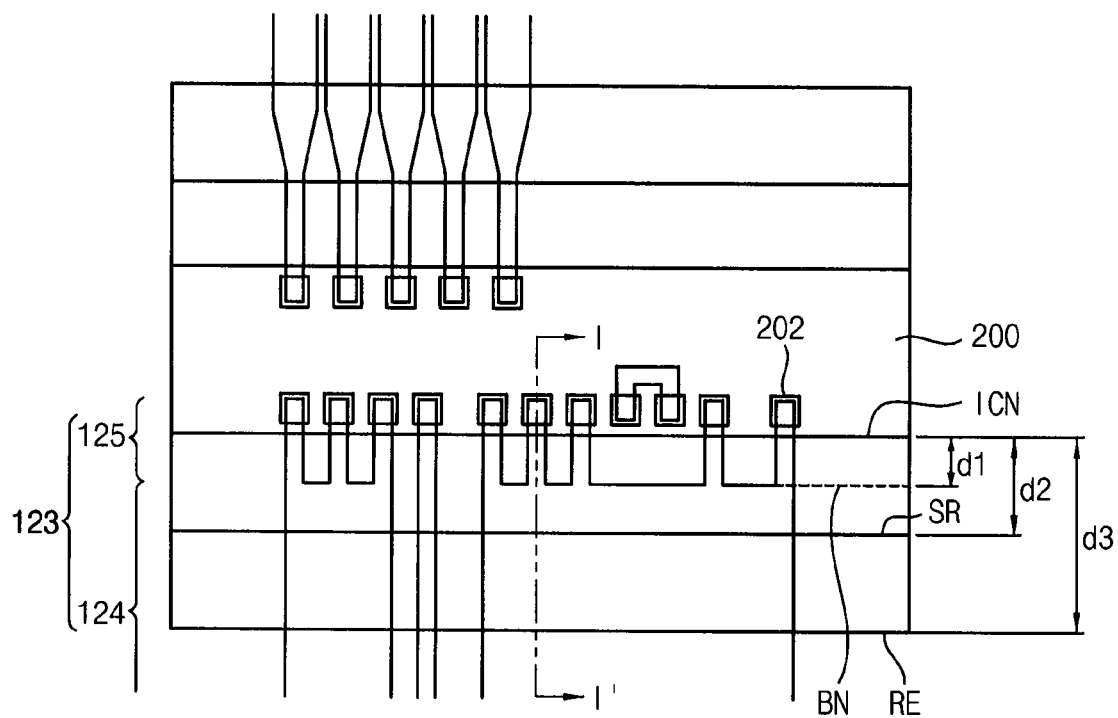
FIG. 4 is a plan view magnifying portion "C" of FIG. 2.
Figure 5:
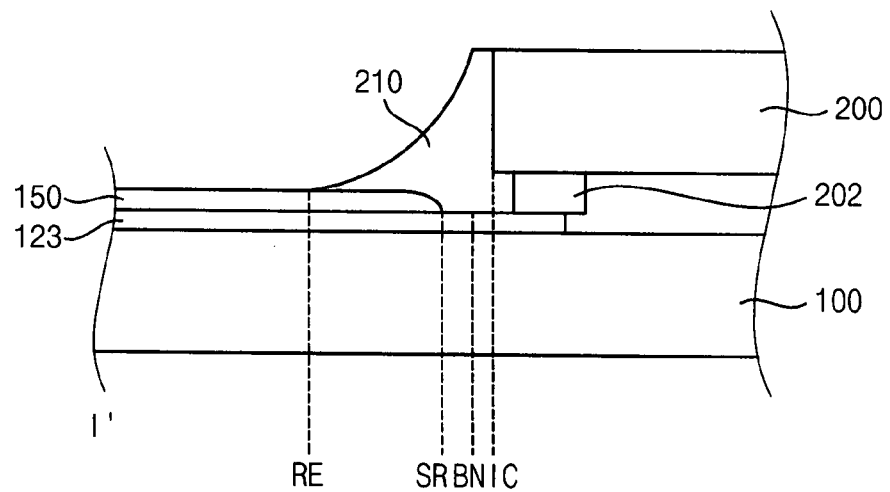
FIG. 5 is a cross-sectional view taken along line I-I' of FIG. 4.

FIG. 4 is a plan view magnifying portion "C" of FIG. 2. FIG. 5 is a cross-sectional view taken along line I-I' of FIG. 4.

Referring to FIGS. 4 and 5, an IC chip 200, a protecting layer 150 and a sealing part 210 are disposed on the tape package 730 of FIG. 2.

The protecting layer 150 is disposed on the input lead line 120 (refer to FIG. 2) and the output lead line 130 (refer to FIG. 2). The protecting layer 150 insulates and protects a circuit pattern including the input lead line 120 and the output lead line 130. The protecting layer 150 exposes a portion of the input lead line 120. The protecting layer 150 is provided to a protecting layer line SR. A portion of the main input lead line 124 of the third portion 123 of the input lead line and the sub input lead line 125 are exposed. Thus, the protecting layer 150 is not disposed on a bottleneck line BN which is provided between the main input lead line 124 and the sub input lead line 125. In an exemplary embodiment, the protecting layer 150 may be a solder resist, for example.

The IC chip 200 is disposed on the IC chip mounting area 110. The IC chip 200 includes a plurality of terminals 202 disposed under the IC chip 200. The terminals 202 are disposed on the exposed sub input lead line 125, so that the IC chip 200 is electrically connected with the input lead line 120 (refer to FIG. 2).

Terminals among the terminals 202 to which same signal is applied, may be respectively connected with the sub input lead lines 125 extended from one main input lead line 124.

The sealing part 210 surrounds the IC chip 200 to fix the IC chip 200 on the base substrate 100. The sealing part 210 covers side of the IC chip 200, a portion of the input lead line 120 and a portion of the protecting layer 150. The sealing part 210 is provided to a sealing part line RE. In an exemplary embodiment, the sealing part 210 may include epoxy resin, for example.

In a plan view, the bottleneck line BN is spaced apart from a side line ICN of the IC chip 200 by a first distance d1. In a plan view, the protecting layer line SR is spaced apart from the side line ICN by a second distance d2. In a plan view, the sealing part line RE is spaced apart from the side line ICN by a third distance d3. The second distance d2 is larger than the first distance d1. The third distance d3 is larger than the second distance d2.

In an exemplary embodiment, the first distance d1 may be about 25 micrometers (μm) to about 75 μm. In the exemplary embodiment, the first distance d1 may preferably be about 50 μm. In an exemplary embodiment, the second distance d2 may be about 100 μm to about 300 μm. In the exemplary embodiment, the second distance d2 may preferably be about 200 μm. In an exemplary embodiment, the third distance d3 may be about 400 μm to about 600 μm. In the exemplary embodiment, the third distance d3 may preferably be about 500 μm. Although the first distance d1 is about 25 μm to about 75 μm according to relationship of the first distance d1, the second distance d2 and the third distance d3 in the exemplary embodiment, the invention is not limited thereto, and the first to third distances d1, d2 and d3 may have variable combinations. Thus, in an exemplary embodiment, the first distance d1 may be about 25 μm to about 300 μm, and the first distance d1 may be greater than the second distance d2.

The bottleneck region of the third portion 123 of the input lead line 120 is disposed under the sealing part 150. Although the tape package 730 is bent by an external force, the portion of the base substrate 100 corresponding to the bottleneck region may be hardly bent because of the sealing part 150. Thus, a crack of the circuit pattern in the bottleneck region may be prevented.

Figure 6:
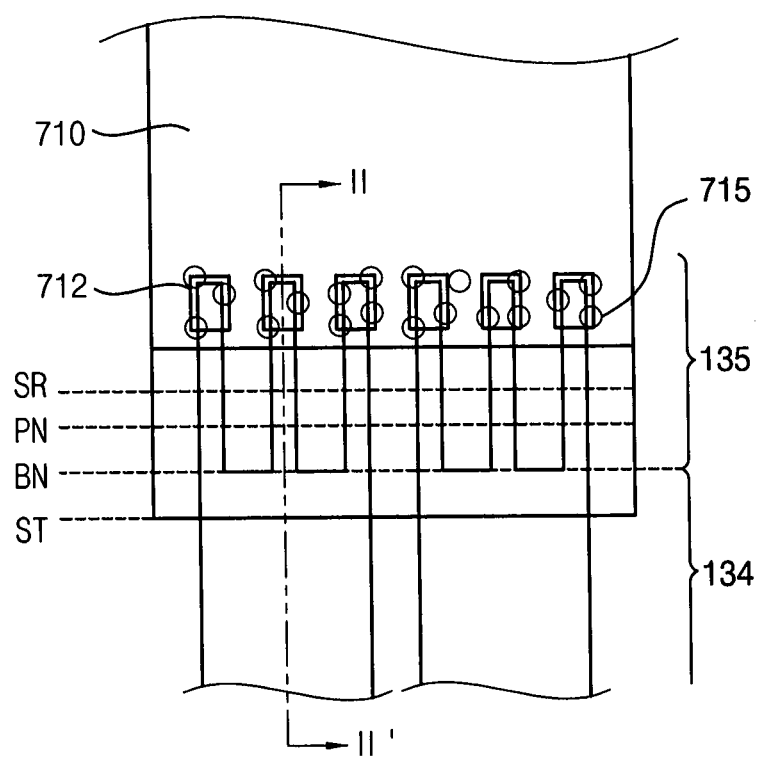
FIG. 6 is a plan view magnifying portion "B" of FIG. 1.
Figure 7:
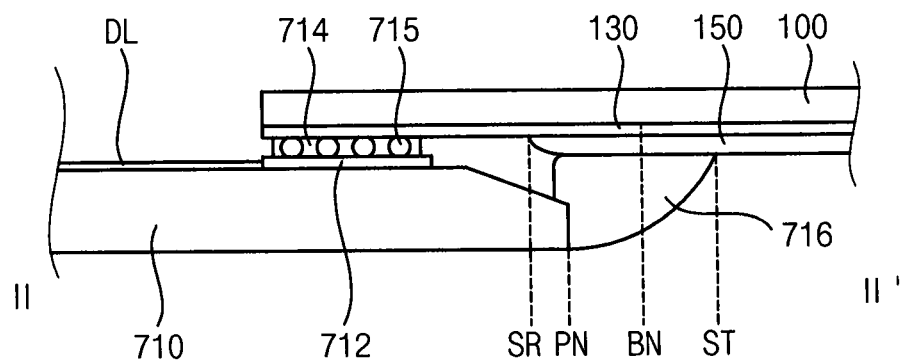
FIG. 7 is a cross-sectional view taken along line II-IF of FIG. 6.

FIG. 6 is a plan view magnifying portion "B" of FIG. 1. FIG. 7 is a cross-sectional view taken along line II-IF of FIG. 6.

Referring to FIGS. 6 and 7, the figures illustrate a shape of the tape package 730 of FIG. 2 which is connected with a display panel 710. The tape package 730 includes a base substrate 100, an output lead line 130 and a protecting layer 150. The display panel 710 includes a terminal 712 and a conductive adhesive layer 714. The tape package 730 is substantially same as the tape package 730 of FIGS. 2 to 5. Thus, any further detailed descriptions concerning the same elements will be omitted.

The output lead line 130 includes a first portion 131 (refer to FIG. 3), a second portion 132 (refer to FIG. 3) and a third portion 133 (refer to FIG. 3).

The third portion 133 of the output lead line 130 includes a main output lead line 134 and a sub output lead line 135. The sub output lead line 135 branches off and extends from the main output lead line 134. Accordingly, a plurality of the sub output lead lines 135 may be provided. Thus, a width of the sub output lead line 135 is smaller than that of the main output lead line 134, so that a bottleneck region is provided between the main output lead line 134 and the sub output lead line 135.

The protecting layer 150 is disposed under the output lead line 130. The protecting layer 150 insulates and protects a circuit pattern including the output lead line 130. The protecting layer 150 exposes a portion of the output lead line. The protecting layer 150 is provided to a protecting layer line SR. A portion of the sub output lead line 135 of the third portion of the output lead line 130 is exposed. Thus, the protecting layer 150 is disposed on a bottleneck line BN which is provided between the main output lead line 134 and the sub output lead line 135. In an exemplary embodiment, the protecting layer 150 may be a solder resist, for example.

A reinforcing part 716 covers a side of the panel 710 and a portion of protecting layer 150. The reinforcing part 716 may be provided to a reinforcing part line ST. The reinforcing part 716 attaches and fixes the tape package 730 on the display panel 710, and reinforces strength of the tape package 730. The reinforcing part 716 includes material having flexibility and capable of reinforcing the strength of the tape package 730. In an exemplary embodiment, the reinforcing part 716 may include silicon, for example.

The display panel 710 includes an array substrate and an opposite substrate. A portion of the array substrate is exposed at a side of the display panel 710, so that a terminal 712 which may be connected with the tape package 730 is disposed on the array substrate.

The conductive adhesive layer 714 is disposed on the terminal 712. The conductive adhesive layer 714 includes conductive material, so that a plurality of conductive channels 715 spaced apart each other are provided in the conductive adhesive layer 714. Thus, although the conductive adhesive layer 714 connects to a plurality of terminals 712, the terminals 712 may not be electrically connected with each other.

The sub output lead line 135 is connected with the conductive adhesive layer 714, so that the terminal 712 of the display panel 710 is electrically connected with the sub output lead line 135.

In a plan view, the bottleneck line BN is disposed between a side line PN of the display panel 710 and the reinforcing part line ST. In an exemplary embodiment, the bottleneck line BN is disposed between the protecting layer line SR and the reinforcing part line ST. The reinforcing part line ST may be spaced apart from the side line PN of the display panel 710 by about 0.5 millimeters (mm) to about 1.3 mm.

Thus, the bottleneck region of the first portion of the output lead line 130 is disposed on the reinforcing part 716. Although the tape package 730 is bent by an external force, a portion of the base substrate 100 corresponding to the bottleneck region may be hardly bent because of the reinforcing part 716. Thus, a crack of the circuit pattern in the bottleneck region may be prevented.

Figure 8:
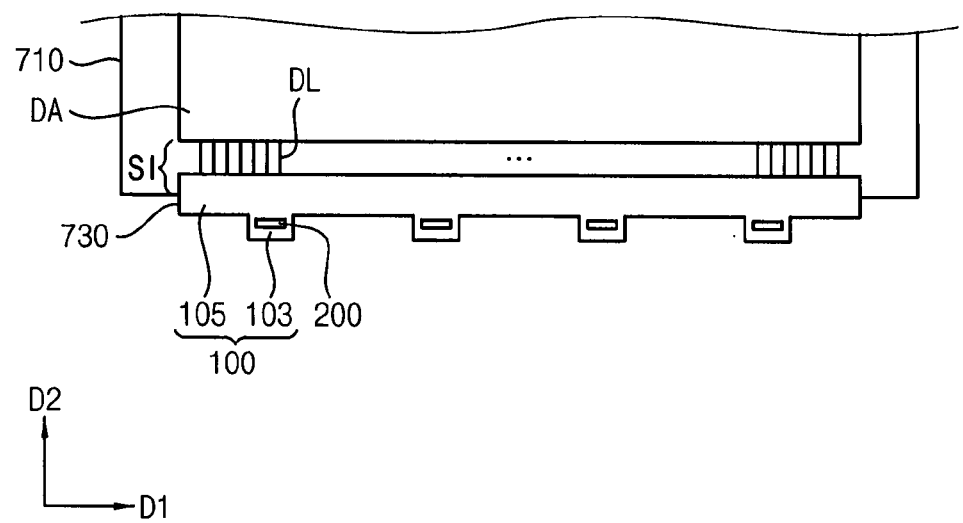
FIG. 8 is a plan view illustrating an exemplary embodiment of a tape package connected with a display panel according to the invention.

FIG. 8 is a plan view illustrating a tape package 730 connected with a display panel according to an exemplary embodiment of the invention.

Referring to FIG. 8, the tape package 730 is electrically connected with the display panel 710.

The tape package 730 may include a base substrate 100 and an IC chip 200. The base substrate 100 includes a material having relatively high flexibility. In an exemplary embodiment, the base substrate 100 may include polyimide and/or epoxy resin, for example. The base substrate 100 includes a signal transmitting area 105 and a protruding area 103 protruded from the signal transmitting area 105. The IC chip 200 may be mounted on the base substrate 100. In an exemplary embodiment, the IC chip 200 may be mounted on the base substrate 100 as a COF structure, for example. In the illustrated exemplary embodiment, four protruding areas 103 may be provided, so that four IC chips 200 mounted on the base substrate 100. However, the invention is not limited thereto, and a different number of the protruding areas 103 may be provided. In the illustrated exemplary embodiment, one tape package 730 may be electrically connected with the display panel 710. However, the invention is not limited thereto, and a different number of the tape package 730 may be provided.

The output lead line 130 (refer to FIG. 2) is disposed in the signal transmitting area 105 of the base substrate 100. The output lead line 130 may transmit a signal to the data line DL of the display panel 710. The output lead line 130 extends from the IC chip 200 to be connected with the display panel 710. An end of the output lead line 130 is electrically connected with the IC chip 200. The output lead line 130 extending from the IC chip 200 is dispersed substantially in a first direction D1. Another end of the output lead line 130 extending from the IC chip 200 extends substantially in a second direction D2 crossing the first direction D1. Thus, another end of the output lead line 130 may be aligned corresponded to the terminal disposed on the signal input part SI of the display panel 710.

Since the output lead line 130 disposed on the tape package 730 extends substantially in the first direction D1, data lines disposed on the signal input part SI may not extend in the first direction D1 but extend in the second direction D2. Thus, a space for dispersing the data lines in the first direction D1 may be omitted. In an exemplary embodiment, data lines disposed on the signal input part SI may have a same length, so that display quality of display apparatus may be improved.

Figure 9:
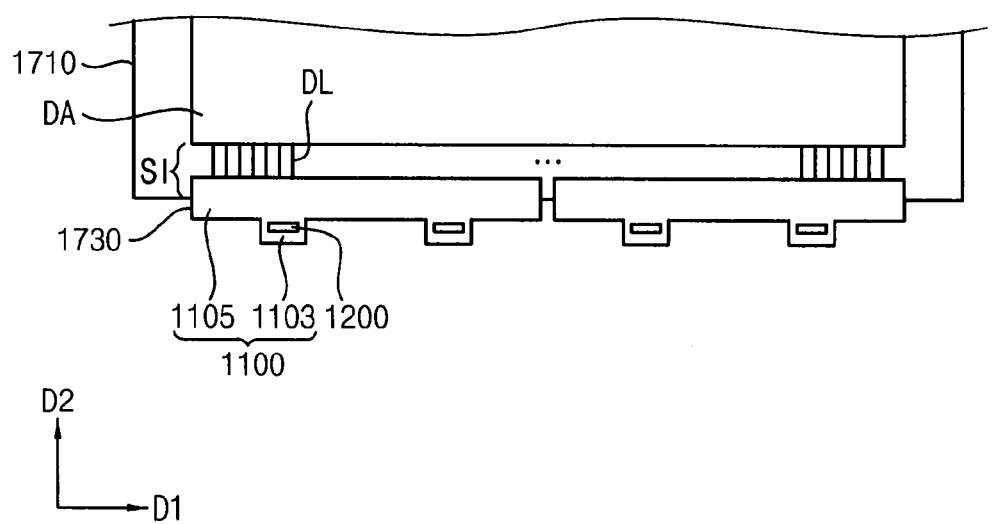
FIG. 9 is a plan view illustrating an exemplary embodiment of a tape package connected with a display panel according to the invention.

FIG. 9 is a plan view illustrating a tape package connected with a display panel according to an exemplary embodiment of the invention.

Referring to FIG. 9, the tape package 1730 is electrically connected with the display panel 1710.

The tape package 1730 may include a base substrate 1100 and an IC chip 1200. The base substrate 1100 includes a material having relatively high flexibility. In an exemplary embodiment, the base substrate 1100 may include polyimide and/or epoxy resin, for example. The base substrate 1100 includes a signal transmitting area 1105 and a protruding area 1103 protruded from the signal transmitting area 1105. The IC chip 1200 may be mounted on the base substrate 1100. In an exemplary embodiment, the IC chip 1200 may be mounted on the base substrate 100 as a COF structure, for example. In the illustrated exemplary embodiment, two protruding areas 1103 may be provided, so that two IC chips 1200 mounted on the base substrate 1100. In the illustrated exemplary embodiment, two tape packages 1730 may be electrically connected with the display panel 1710.

The output lead line (similar to output lead line 130 in FIG. 2) is disposed in the signal transmitting area1 1105 of the base substrate 1100. The output lead line may transmit a signal to the data line DL of the display panel 1710. The output lead line extends from the IC chip 1200 to be connected with the display panel 1710. An end of the output lead line is electrically connected with the IC chip 1200. The output lead line extending from the IC chip 1200 is dispersed in a first direction D1. Another end of the output lead line extending from the IC chip 1200 extends substantially in a second direction D2 crossing the first direction D1. Thus, another end of the output lead line may be aligned corresponded to the terminal disposed on the signal input part SI of the display panel 1710.

Since the output lead line disposed on the tape package 1730 extends substantially in the first direction D1, data lines disposed on the signal input part SI may not extend in the first direction D1 but extend in the second direction D2. Thus, a space for dispersing the data lines in the first direction D1 may be omitted. In an exemplary embodiment, data lines disposed on the signal input part SI may have a same length, so that display quality of display apparatus may be improved.

Figure 10:
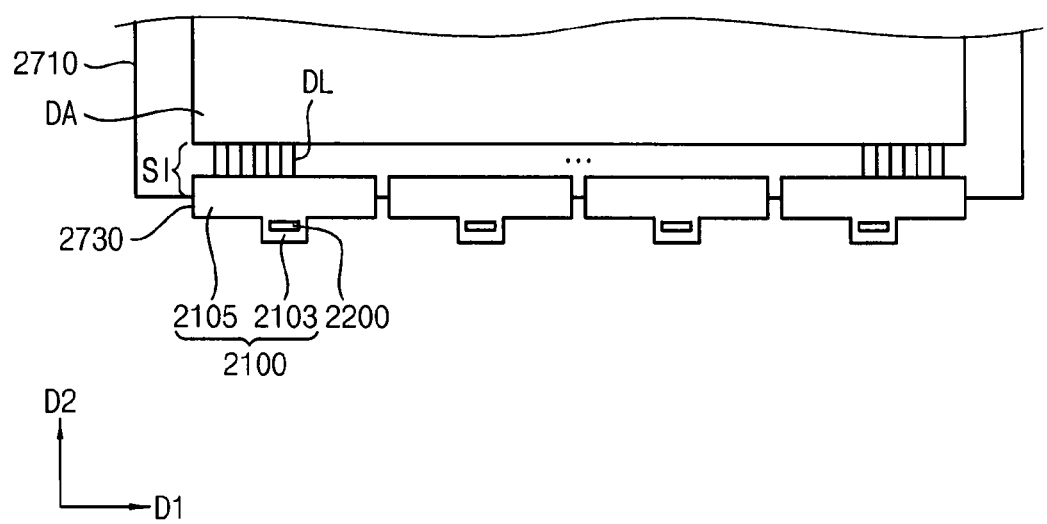
FIG. 10 is a plan view illustrating an exemplary embodiment of a tape package connected with a display panel according to the invention.

FIG. 10 is a plan view illustrating a tape package connected with a display panel according to an exemplary embodiment of the invention.

Referring to FIG. 10, the tape package 2730 is electrically connected with the display panel 2710.

The tape package 2730 may include a base substrate 2100 and an IC chip 2200. The base substrate 2100 includes a material having relatively high flexibility. In an exemplary embodiment, the base substrate 2100 may include polyimide and/or epoxy resin, for example. The base substrate 2100 includes a signal transmitting area 2105 and a protruding area 2103 protruded from the signal transmitting area 2105. The IC chip 2200 may be mounted on the base substrate 2100. In an exemplary embodiment, the IC chip 2200 may be mounted on the base substrate 2100 as a COF structure, for example. In the exemplary embodiment, one protruding area 2103 may be provided, so that one IC chip 2200 mounted on the base substrate 2100. In an exemplary embodiment, four tape packages may be electrically connected with the display panel 2710.

The output lead line (similar to output lead line 130 in FIG. 2) is disposed in the signal transmitting area 2105 of the base substrate 2100. The output lead line may transmit a signal to the data line DL of the display panel 2710. The output lead line extends from the IC chip 2200 to be connected with the display panel 2710. An end of the output lead line is electrically connected with the IC chip 2200. The output lead line extending from the IC chip 2200 is dispersed substantially in a first direction D1. Another end of the output lead line extending from the IC chip 2200 extends substantially in a second direction D2 crossing the first direction D1. Thus, another end of the output lead line may be aligned corresponded to the terminal disposed on the signal input part SI of the display panel 710.

Since the output lead line disposed on the tape package 2730 extends substantially in the first direction D1, data lines disposed on the signal input part SI may not extend in the first direction D1 but extend in the second direction D2. Thus, a space for dispersing the data lines in the first direction D1 may be omitted. In an exemplary embodiment, data lines disposed on the signal input part SI may have a same length, so that display quality of display apparatus may be improved.

Figure 11:
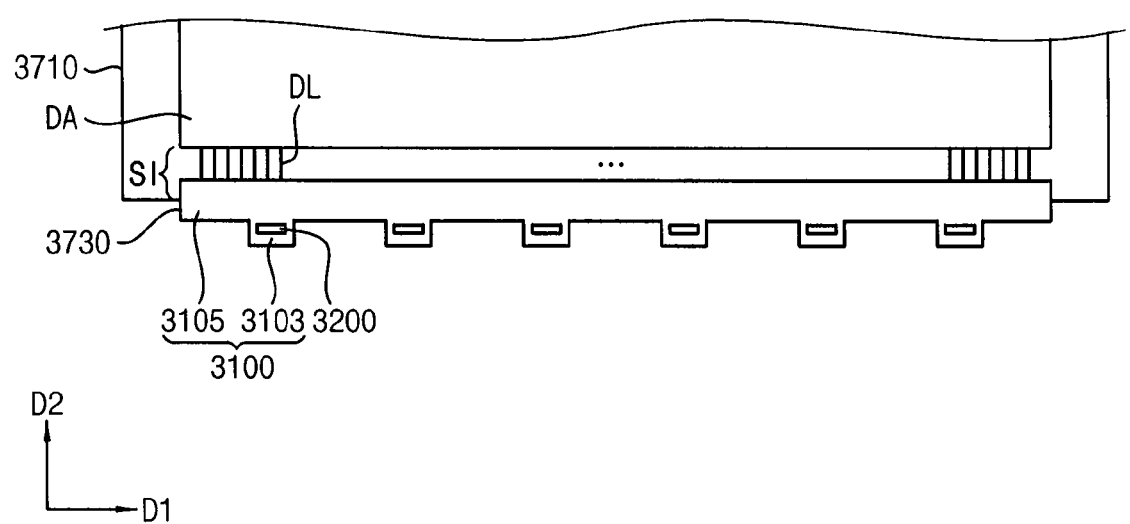
FIG. 11 is a plan view illustrating an exemplary embodiment of a tape package connected with a display panel according to the invention.

FIG. 11 is a plan view illustrating a tape package connected with a display panel according to an exemplary embodiment of the invention.

Referring to FIG. 11, the tape package 3730 is electrically connected with the display panel 3710.

The tape package 3730 may include a base substrate 3100 and an IC chip 3200. The base substrate 3100 includes a material having relatively high flexibility. In an exemplary embodiment, the base substrate 3100 may include polyimide and/or epoxy resin, for example. The base substrate 3100 includes a signal transmitting area 3105 and a protruding area 3103 protruded from the signal transmitting area 3105. The IC chip 3200 may be mounted on the base substrate 3100. In an exemplary embodiment, the IC chip 3200 may be mounted on the base substrate 3100 as a COF structure. In the illustrated exemplary embodiment, six protruding area 3103 may be provided, so that six IC chip 3200 mounted on the base substrate 3100. In the illustrated exemplary embodiment, one tape package may be electrically connected with the display panel 3710.

The output lead line (similar to the output lead line 130 of FIG. 2) is disposed in the signal transmitting area 3105 of the base substrate 3100. The output lead line may transmit a signal to the data line DL of the display panel 3710. The output lead line extends from the IC chip 3200 to be connected with the display panel 3710. An end of the output lead line is electrically connected with the IC chip 3200. The output lead line extending from the IC chip 3200 is dispersed in a first direction D1. Another end of the output lead line extending from the IC chip 3200 extends substantially in a second direction D2 crossing the first direction D1. Thus, another end of the output lead line may be aligned corresponded to the terminal disposed on the signal input part SI of the display panel 3710.

Since the output lead line disposed on the tape package 3730 extends substantially in the first direction D1, data lines disposed on the signal input part SI may not extend in the first direction D1 but extend in the second direction D2. Thus, a space for dispersing the data lines in the first direction D1 may be omitted. In an exemplary embodiment, data lines disposed on the signal input part SI may have a same length, so that display quality of display apparatus may be improved.

Figure 12:
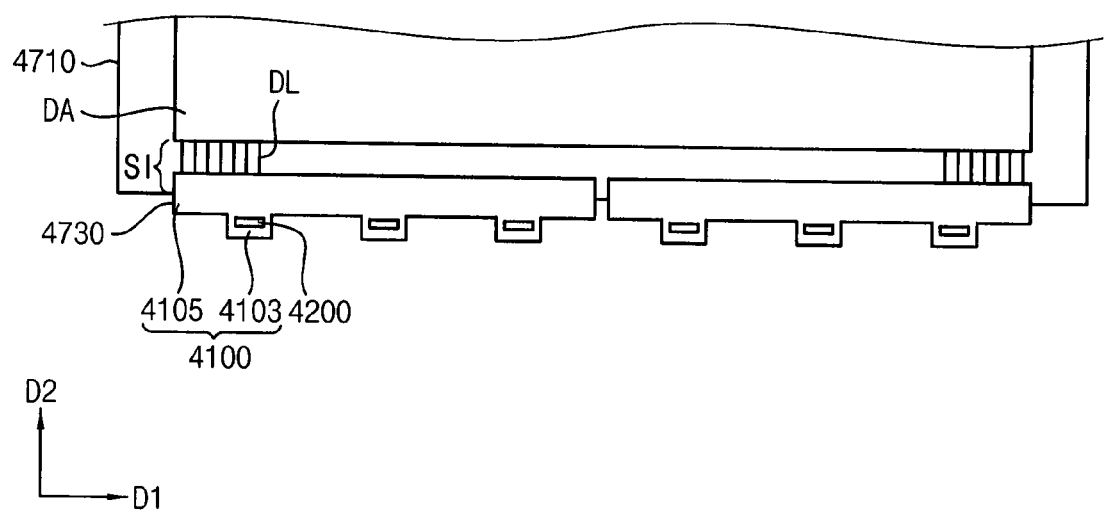
FIG. 12 is a plan view illustrating an exemplary embodiment of a tape package connected with a display panel according to the invention.

FIG. 12 is a plan view illustrating a tape package connected with a display panel according to an exemplary embodiment of the invention.

Referring to FIG. 12, the tape package 4730 is electrically connected with the display panel 4710.

The tape package 4730 may include a base substrate 4100 and an IC chip 4200. The base substrate 4100 includes a material having relatively high flexibility. In an exemplary embodiment, the base substrate 4100 may include polyimide and/or epoxy resin, for example. The base substrate 4100 includes a signal transmitting area 4105 and a protruding area 4103 protruded from the signal transmitting area 4105. The IC chip 4200 may be mounted on the base substrate 4100. In an exemplary embodiment, the IC chip 4200 may be mounted on the base substrate 4100 as a COF structure, for example. In the illustrated exemplary embodiment, three protruding area 4103 may be provided, so that three IC chip 4200 mounted on the base substrate 4100. In the illustrated exemplary embodiment, two tape packages may be electrically connected with the display panel 4710.

The output lead line (similar to output lead line 130 of FIG. 2) is disposed in the signal transmitting area 4105 of the base substrate 4100. The output lead line may transmit a signal to the data line DL of the display panel 4710. The output lead line extends from the IC chip 200 to be connected with the display panel 4710. An end of the output lead line is electrically connected with the IC chip 4200. The output lead line extending from the IC chip 4200 is dispersed in a first direction D1. Another end of the output lead line extending from the IC chip 4200 extends substantially in a second direction D2 crossing the first direction D1. Thus, another end of the output lead line may be aligned corresponded to the terminal disposed on the signal input part SI of the display panel 4710.

Since the output lead line disposed on the tape package 4730 extends substantially in the first direction D1, data lines disposed on the signal input part SI may not extend in the first direction D1 but extend in the second direction D2. Thus, a space for dispersing the data lines in the first direction D1 may be omitted. In an exemplary embodiment, data lines disposed on the signal input part SI may have a same length, so that display quality of display apparatus may be improved.

According to the invention as explained above, since the output lead line disposed on the tape package extends substantially in a horizontal direction, data lines disposed on the signal input part may not extend in the horizontal direction but extend in a vertical direction. Thus, a space for dispersing the data lines in the horizontal direction may be omitted.

In addition, data lines disposed on the signal input part may have a same length. Thus, display quality of display apparatus may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A tape package comprising:
    a base substrate comprising a signal transmitting area, and a protruding area protruded from the signal transmitting area;
    an integrated circuit chip mounted on the base substrate; and
    a lead line disposed on the base substrate and comprising:
        a first portion electrically connected with the integrated circuit chip;
        a second portion electrically connected with the first portion and extending in a first direction; and
        a third portion electrically connected with the second portion and extending in a second direction crossing the first direction.

2. The tape package of claim 1, further comprising a protecting layer which covers the lead line.

3. The tape package of claim 2, wherein the lead line further comprises:
    a main lead line; and
    a sub lead line which is branched off and extends from the main lead line.

4. The tape package of claim 3,
    wherein the lead line further comprises a plurality of sub lead lines which is separated from each other and extends from the main lead line, and
    wherein a sum of widths of the plurality of sub lead lines is smaller than a width of the main lead line.

5. The tape package of claim 3, further comprising:
    a sealing part configured to fix the integrated circuit chip on the base substrate, and cover at least a portion of the main lead line.

6. The tape package of claim 5, wherein
    the protecting layer covers the main lead line, and
    the sealing part covers the sub lead line and a portion of the protecting layer.

7. The tape package of claim 1, wherein a number of the integrated circuit chip mounted on the base substrate is six.

8. The tape package of claim 1, wherein a number of the integrated circuit chip mounted on the base substrate is four.

9. The tape package of claim 1, wherein a number of the integrated circuit chip mounted on the base substrate is two.

10. The tape package of claim 1, wherein the base substrate is a flexible substrate.

11. A display apparatus comprising:
    a tape package comprising:
        a base substrate comprising a signal transmitting area, and a protruding area protruded from the signal transmitting area;
        an integrated circuit chip mounted on the base substrate; and
        an output lead line electrically connected with the integrated circuit chip, and a display panel comprising:
        a data line electrically connected with the output lead line;
        a display area, and peripheral area surrounding the display area; and
        a plurality of data lines having a same length is disposed between the display area and the tape package.

12. The display apparatus of claim 11, further comprising a reinforcing part which is configured to fix the tape package to the display panel, and cover a portion of the output lead line.

13. The display apparatus of claim 12, wherein the tape package further comprises a protecting layer disposed between the output lead line and the reinforcing part.

14. The display apparatus of claim 12, wherein the output lead line comprises:
    a main output lead line; and
    a sub output lead line which is branched off and extends from the main output lead line.

15. The display apparatus of claim 14,
    wherein the output lead line comprises a plurality of sub output lead lines which is separated from each other and extends from the main output lead line, and
    wherein a sum of widths of the plurality of sub output lead lines is smaller than a width of the main output lead line.

16. The display apparatus of claim 14, wherein
    the sub output lead line of the tape package is electrically connected with the display panel through a conductive adhesive layer disposed on the display panel, and
    the conductive adhesive layer comprises a plurality of conductive channels spaced apart from each other.

17. The display apparatus of claim 11, wherein the tape package further comprises:
    an input lead line disposed on the protruding area and comprising a main input lead line, and a sub input lead line which is branched off and extends from the main input lead line; and
    a sealing part configured to fix the integrated circuit chip on the base substrate, and cover at least a portion of the main input lead line.

18. The display apparatus of claim 17, further comprising a driving part electrically connected with the input lead line of the tape package.

19. The display apparatus of claim 11, wherein the base substrate is a flexible substrate.

20. The display apparatus of claim 11, wherein the integrated circuit chip is mounted on the base substrate as a chip-on-film structure.

* * * * *